United States Patent
Yoon

(10) Patent No.: US 10,944,373 B2
(45) Date of Patent: Mar. 9, 2021

(54) LUMPED ELEMENT DIRECTIONAL COUPLER HAVING ASYMMETRICAL STRUCTURE

(71) Applicant: UNIVERSITY-INDUSTRY COOPERATION GROUP OF KYUNG HEE UNIVERSITY, Gyeonggi-do (KR)

(72) Inventor: Sang Woong Yoon, Gyeonggi-do (KR)

(73) Assignee: UNIVERSITY-INDUSTRY COOPERATION GROUP OF KYUNG HEE UNIVERSITY, Gyeonggi-do (KR)

( * ) Notice: Subject to any disclaimer, the term of this patent is extended or adjusted under 35 U.S.C. 154(b) by 63 days.

(21) Appl. No.: 16/175,004

(22) Filed: Oct. 30, 2018

(65) Prior Publication Data

US 2019/0158053 A1   May 23, 2019

(30) Foreign Application Priority Data

Nov. 22, 2017   (KR) .................. 10-2017-0156681

(51) Int. Cl.
| | |
|---|---|
| H03H 7/48 | (2006.01) |
| H01P 5/18 | (2006.01) |
| H03H 7/01 | (2006.01) |
| H03H 11/48 | (2006.01) |
| H03H 11/36 | (2006.01) |

(52) U.S. Cl.
CPC ........ *H03H 7/0123* (2013.01); *H03H 7/0115* (2013.01); *H03H 7/1758* (2013.01); *H03H 7/1775* (2013.01); *H03H 7/48* (2013.01); *H03H 11/36* (2013.01); *H03H 11/481* (2013.01)

(58) Field of Classification Search
CPC .............. H01P 5/18; H01P 5/184; H03H 7/48
USPC ......................... 333/109–112, 116
See application file for complete search history.

(56) References Cited

U.S. PATENT DOCUMENTS

| | | | | |
|---|---|---|---|---|
| 8,928,428 | B2 * | 1/2015 | Gorbachov | H01P 5/185 333/109 |
| 2013/0201882 | A1 * | 8/2013 | Bauder | H03H 7/48 370/277 |
| 2013/0207741 | A1 * | 8/2013 | Presti | H03H 7/48 333/111 |
| 2013/0285763 | A1 * | 10/2013 | Granger-Jones | H03H 7/48 333/111 |

* cited by examiner

*Primary Examiner* — Dean O Takaoka
(74) *Attorney, Agent, or Firm* — Ladas & Parry, LLP

(57) ABSTRACT

A lumped element directional coupler having an asymmetrical structure. The lumped element directional coupler can be integrated while being compact by using lumped elements, instead of transmission lines, have broadband characteristics through the lumped elements being asymmetrically arranged, and further increase bandwidth by additionally providing a negative capacitor element or, more particularly, a negative capacitor element having loss.

6 Claims, 10 Drawing Sheets

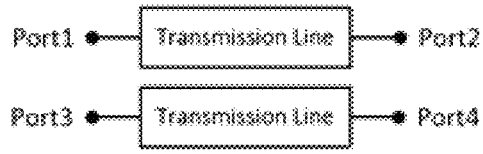
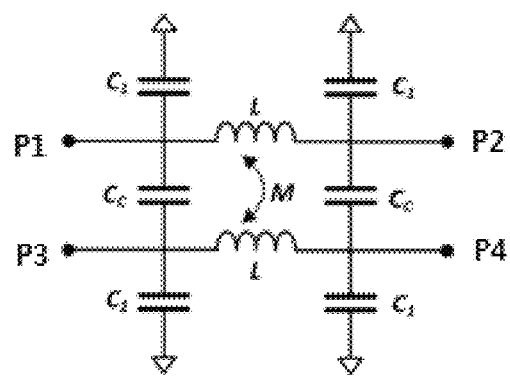
FIG. 1A
FIG. 1B

LUMPED ELEMENT DIRECTIONAL COUPLER HAVING ASYMMETRICAL STRUCTURE

CROSS REFERENCE TO RELATED APPLICATION

The present application claims priority to Korean Patent Application Number 10-2017-0156681 filed on Nov. 22, 2017, the entire contents of which are incorporated herein for all purposes by this reference.

BACKGROUND

Field

The present disclosure relates to a lumped element directional coupler having an asymmetrical structure and, more particularly, to a lumped element directional coupler that can be integrated while being compact by using lumped elements, instead of transmission lines, that can have broadband characteristics through the lumped elements being asymmetrically arranged, and that can further increase bandwidth by additionally providing a negative capacitor element or, more particularly, a negative capacitor element having loss.

Description

A directional coupler is a key component in a radio frequency (RF) system. The directional coupler is used to measure the strength of a signal traveling to an intended node in the RF system. This is intended to control the operation of the entire RF system, based on information regarding the strength of the signal.

The directional coupler must be able to measure the strength of the signal by extracting a small fraction of the signal in a direction in which the signal travels. The directional coupler must be designed such that a reflected wave traveling in the reverse direction, generated by reflection of the traveling signal at a specific load, does not distort the measurement of the strength of the signal.

Typically, the directional coupler is designed using transmission lines illustrated in FIG. 1A. However, when the transmission lines are used, the length of the transmission lines is designed to be equal to ¼ of the wavelength of a center frequency, and is excessively long in the case of a frequency band of 1 to 2 GHz that a number of wireless communications RF systems use. In this case, it may be impossible to integrate the directional coupler while having a small size. Thus, when semiconductor technology is used for on-chip integration, the directional coupler is designed to have a lumped element, such as an inductor or a capacitor, as illustrated in FIG. 1B.

However, the lumped element directional coupler has narrow band characteristics, i.e. the lumped element directional coupler operates in a narrow frequency band. When terminal 1 is used as an input terminal and terminal 2 is used as an output terminal, as illustrated in FIG. 1B, terminal 3 acts as a coupled terminal, and terminal 4 acts as an isolated terminal.

The performance of the directional coupler is represented by four types of performance: coupling performance S31, isolation performance S41, transmission performance S21, and matching performance S11. The bandwidth of the lumped element directional coupler is generally determined by the isolation of the four types of performance.

As illustrated in FIG. 1B, the lumped element directional coupler of the related art is designed to be symmetrical in vertical and lateral directions. This symmetrical directional coupler may be designed as a lumped element directional coupler having a symmetrical structure to obtain a signal of 10 dB, a relatively low power, from an input signal having a center frequency of 1 GHz. In this case, as described in FIG. 2, when the bandwidth is set to be a frequency band having an isolation characteristic of −40 dB, a narrow band characteristic of 90 MHz at around 1 GHz may be observed.

Accordingly, in the case of designing the lumped element directional coupler, there is demand to increase the bandwidth of the lumped element directional coupler by broadbanding the isolation characteristic.

The information disclosed in the Background section is only provided for a better understanding of the background and should not be taken as an acknowledgment or any form of suggestion that this information forms prior art that would already be known to a person skilled in the art.

BRIEF SUMMARY

Various aspects of the present disclosure provide a lumped element directional coupler that can be integrated while being compact by using lumped elements, instead of transmission lines, and can have broadband characteristics through the lumped elements being asymmetrically arranged.

Also provided is a lumped element directional coupler that can further increase bandwidth by additionally providing a negative capacitor element or, more particularly, a negative capacitor element having loss.

The object of the present disclosure is not limited to the aforementioned description, and other objects not explicitly disclosed herein will be clearly understood by a person skilled in the art from the description provided hereinafter.

According to an aspect, a directional coupler may include an input terminal, an output terminal, a coupled terminal, and an isolated terminal. The magnitude of impedance between the input terminal and the output terminal is different from the magnitude of impedance between the coupled terminal and the isolated terminal.

The magnitude of impedance between the input terminal and the coupled terminal may be the same as the magnitude of impedance between the coupled terminal and the isolated terminal.

A first capacitor and a second capacitor connected to the input terminal and the output terminal, respectively, may have same levels of capacitance. A third capacitor and a fourth capacitor connected to the coupled terminal and the isolated terminal, respectively, may have same levels of capacitance. The first capacitor and the third capacitor may have different levels of capacitance.

A first inductor and a second inductor may be connected between the input terminal and the output terminal in series. A third inductor inductively coupled to the first inductor and a fourth inductor inductively coupled to the second inductor may be connected between the coupled terminal and the isolated terminal in series. A negative capacitor element having a positive reactance component may be provided between third inductor and the fourth inductor and connected to the third inductor and the fourth inductor in series.

The negative capacitor element may include: a first negative capacitor element connected to the third inductor in series to provide a positive reactance component to the third inductor; and a second negative capacitor element connected to the fourth inductor in series to provide a positive reactance component to the fourth inductor.

When each of the third inductor and the fourth inductor has reactance of $(L-\Delta L)/2$, the negative capacitor element may provide reactance of $\Delta L/2$ to each of the third inductor and the fourth inductor.

The lumped element directional coupler according to the present disclosure can be integrated while being compact by using lumped elements, instead of transmission lines, and can have broadband characteristics through the lumped elements being asymmetrically arranged.

In addition, the lumped element directional coupler according to the present disclosure can further increase bandwidth by additionally providing a negative capacitor element or, more particularly, a negative capacitor element having loss.

BRIEF DESCRIPTION OF THE DRAWINGS

The above and other objects, features and advantages of the present disclosure will be more clearly understood from the following detailed description when taken in conjunction with the accompanying drawings, in which:

FIGS. 1A and 1B are circuit diagrams illustrating a related-art lumped element directional coupler having a symmetrical structure;

DETAILED DESCRIPTION

The technical or scientific terms used herein are for the purpose of describing particular exemplary embodiments only and are not intended to be limiting of the present disclosure. In addition, the technical or scientific terms used herein should be understood as having the same meaning as commonly understood by a person skilled in the art to which the present disclosure relates, and should not be interpreted in an overly broad or narrow manner, unless expressly so defined herein. If any technical terms used herein fail in correctly representing the idea of the present disclosure, they should be substituted with technical terms correctly understandable by a person skilled in the art to which the present disclosure relates.

Descriptions of components in the singular form used herein are intended to include descriptions of components in the plural form, unless explicitly described to the contrary. It will be understood that the terms "comprise," "include," and any variations thereof used herein shall not be interpreted as essentially including all components or steps described herein, and are intended to cover non-exclusive inclusions unless explicitly described to the contrary.

In addition, the accompanying drawings shall be interpreted as being provided for a better understanding, while not being limitative, of the principle of the present disclosure.

Figure 2:
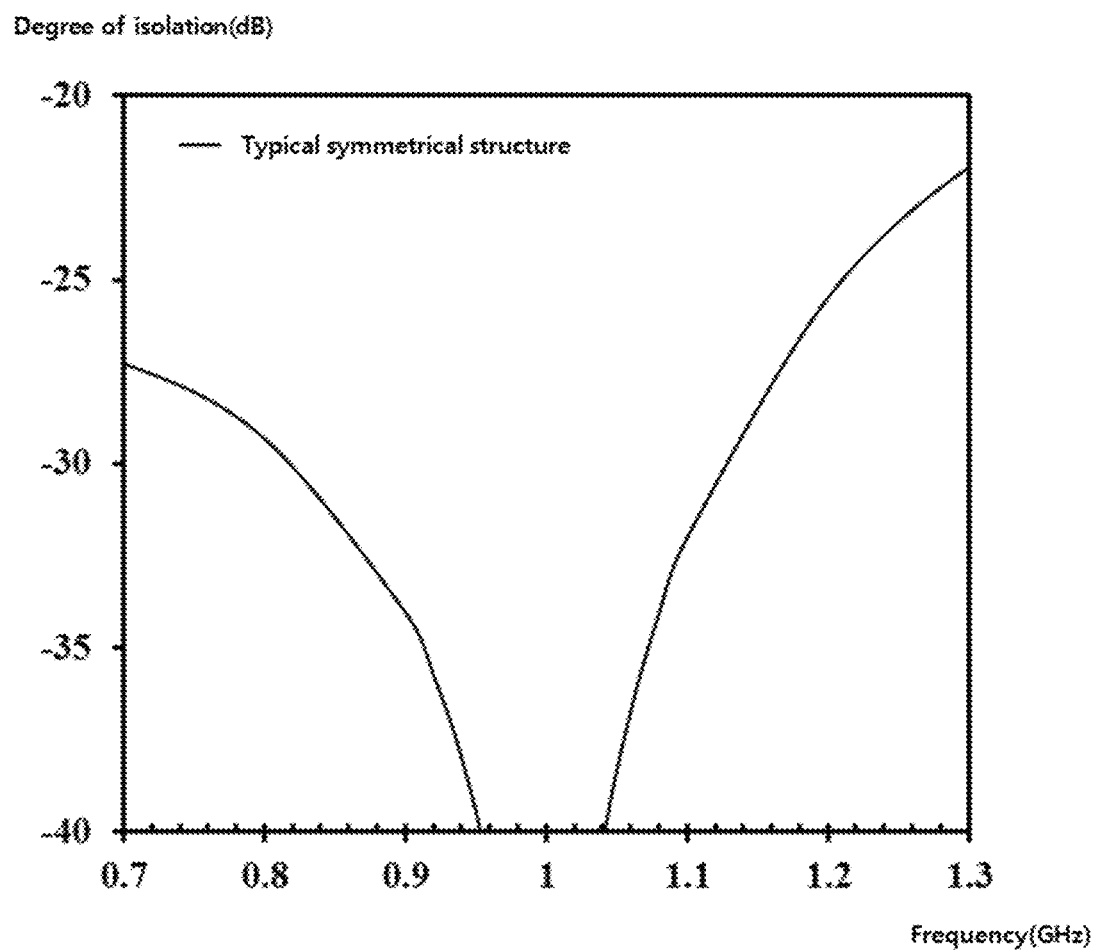
FIG. 2 is a graph illustrating a bandwidth of the related-art lumped element directional coupler having a symmetrical structure.
Figure 3:
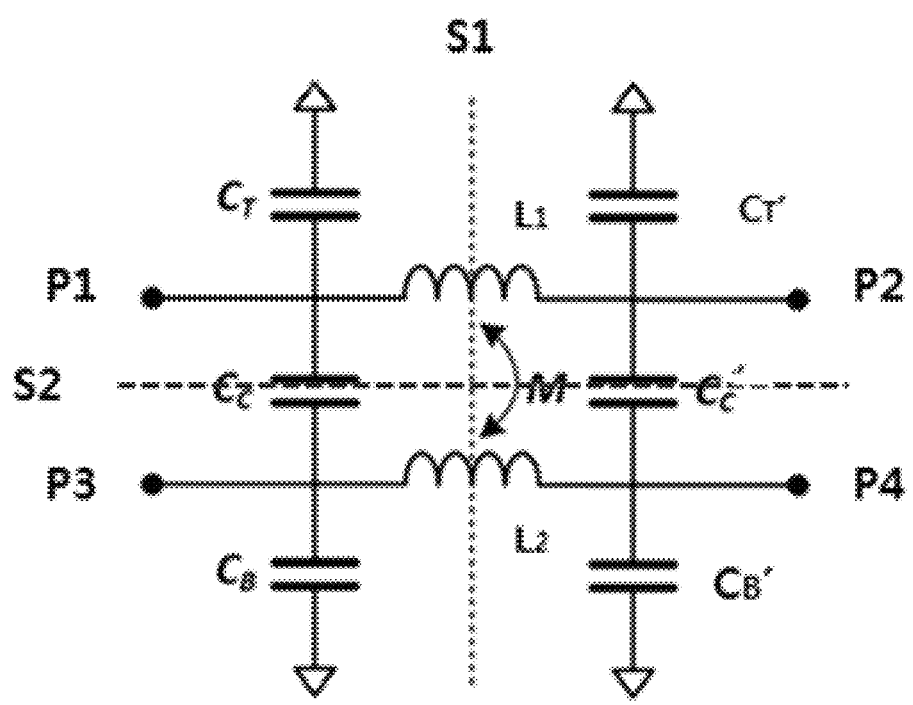
FIG. 3 is a circuit diagram illustrating a lumped element directional coupler according to an exemplary embodiment.

FIG. 3 is a circuit diagram illustrating a lumped element directional coupler according to an exemplary embodiment.

Referring to FIG. 3, a first capacitor $C_T$ and a second capacitor $C_c$ are connected to an input terminal P1 in parallel, and a first inductor $L_1$ is provided between the first capacitor $C_T$ and the second capacitor $C_c$ to be connected to the first capacitor $C_T$ and the second capacitor $C_c$ in parallel. The first inductor $L_1$ is provided between a third capacitor $C_T'$ and a fourth capacitor $C_c'$ connected to an output terminal P2 in parallel, and is connected to the third capacitor $C_T'$ and the fourth capacitor $C_c'$ in parallel.

The second capacitor $C_c$ and a fifth capacitor $C_B$ are connected to a coupled terminal P3 in parallel, and a second inductor $L_2$ is provided between the second capacitor $C_c$ and the fifth capacitor $C_B$ to be connected to the second capacitor $C_c$ and the fifth capacitor $C_B$ in parallel. The second inductor $L_2$ is provided between the fourth capacitor $C_c'$ and a sixth capacitor $C_B'$ to be connected to the fourth capacitor $C_c'$ and the sixth capacitor $C_B'$ in parallel.

As described above, the directional coupler according to an exemplary embodiment uses a lumped element, such as a capacitor or an inductor, instead of transmission lines. Accordingly, when the directional coupler is fabricated, it can be advantageously integrated while having a small size.

The first capacitor $C_T$ and the third capacitor $C_T'$ have the same level of capacitance, the second capacitor $C_c$ and the fourth capacitor $C_c'$ have the same level of capacitance, and the fifth capacitor $C_B$ and the sixth capacitor $C_B'$ have the same level of capacitance. In addition, the first capacitor $C_T$ and the fifth capacitor $C_B$ have different levels of capacitance.

Accordingly, the lumped element directional coupler according to an exemplary embodiment has a laterally symmetrical structure based on a first reference line S1 and a vertically asymmetrical structure based on a second reference line S2. Thus, the impedance between the input terminal P1 and the coupled terminal P3 is the same as the impedance between the output terminal P2 and the isolated terminal P4, whereas the impedance between the input terminal P1 and the output terminal P2 is different from the impedance between the coupled terminal P3 and the isolated terminal P4.

Figure 4:
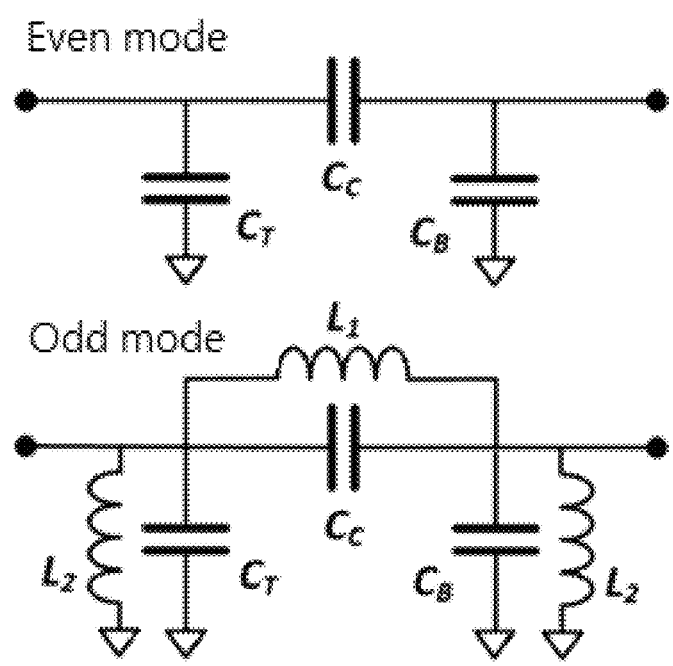
FIG. 4 is a circuit diagram illustrating an even mode equivalent circuit and an odd mode equivalent circuit based on a first reference line in the lumped element directional coupler according to an exemplary embodiment.

FIG. 4 is a circuit diagram illustrating an even mode equivalent circuit and an odd mode equivalent circuit based on a first reference line in the lumped element directional coupler according to an exemplary embodiment.

Described in more detail with reference to FIG. 4, the magnitudes of $L_1$ and $L_2$ in the odd mode equivalent circuit are calculated using parameters L and M, as expressed in following Formula 1.

$$L_1 = (L-M) + \frac{(L-M)^2}{2M}, L_2 = \frac{L+M}{2} \quad (1)$$

The even mode equivalent circuit and the odd mode equivalent circuit using the values of respective components are expressed using ABCD parameters, as in following Formulas 2 and 3.

$$\begin{bmatrix} A_e & B_e \\ C_e & D_e \end{bmatrix}_{even\text{-}mode} = \begin{bmatrix} \frac{C_B}{C_C} + 1 & \frac{1}{j\omega C_C} \\ \frac{j\omega(C_C C_T + C_C C_B + C_T C_B)}{C_C} & \frac{C_T}{C_C} + 1 \end{bmatrix} \quad (2)$$

$$\begin{bmatrix} A_o & B_o \\ C_o & D_o \end{bmatrix}_{odd\text{-}mode} = \quad (3)$$

$$\begin{bmatrix} 1 + \frac{L_1}{L_2} \cdot \frac{1-\omega^2 L_2 C_B}{1-\omega^2 L_1 C_C} & \frac{j\omega L_1}{1-\omega^2 L_1 C_C} \\ \frac{2-\omega^2 L_2(C_T+C_B)}{j\omega L_2} - \frac{j\omega L_1}{1-\omega^2 L_1 C_C} \\ \frac{(1-\omega^2 L_2 C_T)(1-\omega^2 L_2 C_B)}{\omega^2 L_2} & 1 + \frac{L_1}{L_2} \cdot \frac{1-\omega^2 L_2 C_T}{1-\omega^2 L_1 C_C} \end{bmatrix}$$

When the ABCD parameters are used, a transmission coefficient T can be obtained as in following Formula 4.

$$T = \frac{2}{A + \frac{B}{Z_0} + CZ_0 + D} \quad (4)$$

In Formula 4, $Z_0$ is a characteristic impedance of the circuit.

The isolation characteristic of the lumped element directional coupler according to an exemplary embodiment can be calculated using the transmission coefficient of the even mode and the transmission coefficient of the odd mode, as expressed in following Formula 5.

$$S_{isolation}(S_{41}) = \quad (5)$$

$$\frac{T_{even} - T_{odd}}{2} = \frac{1}{\underbrace{A_e + D_e}_{real} + \underbrace{\frac{B_e}{Z_0} + C_e Z_0}_{imaginary}} - \frac{1}{\underbrace{A_o + D_o}_{real} + \underbrace{\frac{B_o}{Z_0} + C_o Z_0}_{imaginary}}$$

In Formula 5, a formula for obtaining zero (0) from $S_{isolation}$ is as per following Formula 6.

$$A_e + D_e = A_o + D_o, \frac{B_e}{Z_0} + C_e Z_0 = \frac{B_o}{Z_0} + C_o Z_0 \quad (6)$$

From Formula 6, following Formulas 7 and 8 can be obtained. Formula 7 is a formula expressing the isolation characteristic that can be obtained from the lumped element directional coupler according to an exemplary embodiment, and Formula 8 is a formula obtainable from a frequency $\omega_0$ at which the isolation characteristic is required in the lumped element directional coupler according to an exemplary embodiment.

$$2C_C = \frac{L_2}{L_1}(C_T + C_B) = \frac{M}{L-M}(C_T + C_B) \quad (7)$$

$$\omega_0^2 = \frac{Z_0^2 C_C(2L_2 + L_1) - L_2^2}{(2L_1^2 C_C^2 + 2C_C^2 L_1 L_2 - L_2^2 C_B C_T)Z_0^2} \quad (8)$$

When the bandwidth of the lumped element directional coupler having a symmetrical structure of the related art and the bandwidth of the lumped element directional coupler having an asymmetrical structure according to an exemplary embodiment are set as a frequency band having an isolation characteristic of −40 dB or less, it is apparent that the lumped element directional coupler having an asymmetrical structure according to an exemplary embodiment has a bandwidth increase at around 1 GHz, as compared to the lumped element directional coupler having a symmetrical structure of the related art.

Figure 5:
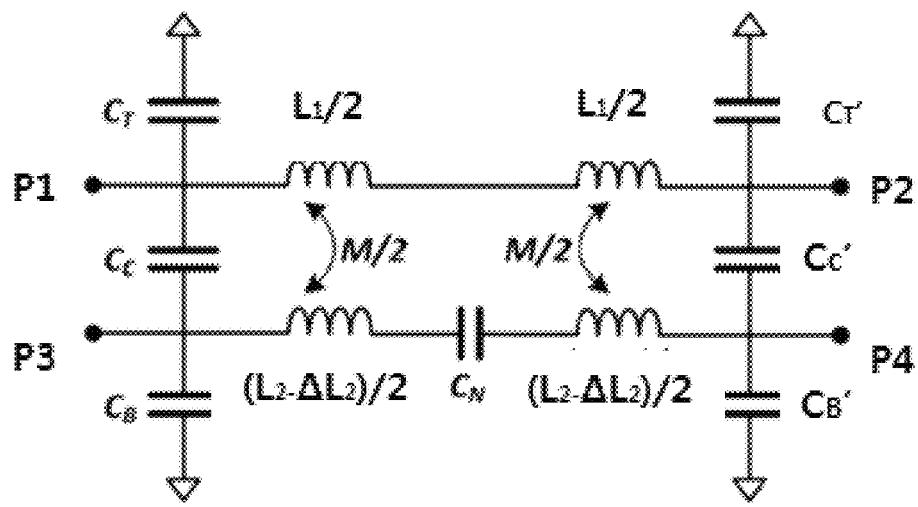
FIG. 5 is a circuit diagram illustrating a lumped element directional coupler according to another exemplary embodiment.
Figure 6:
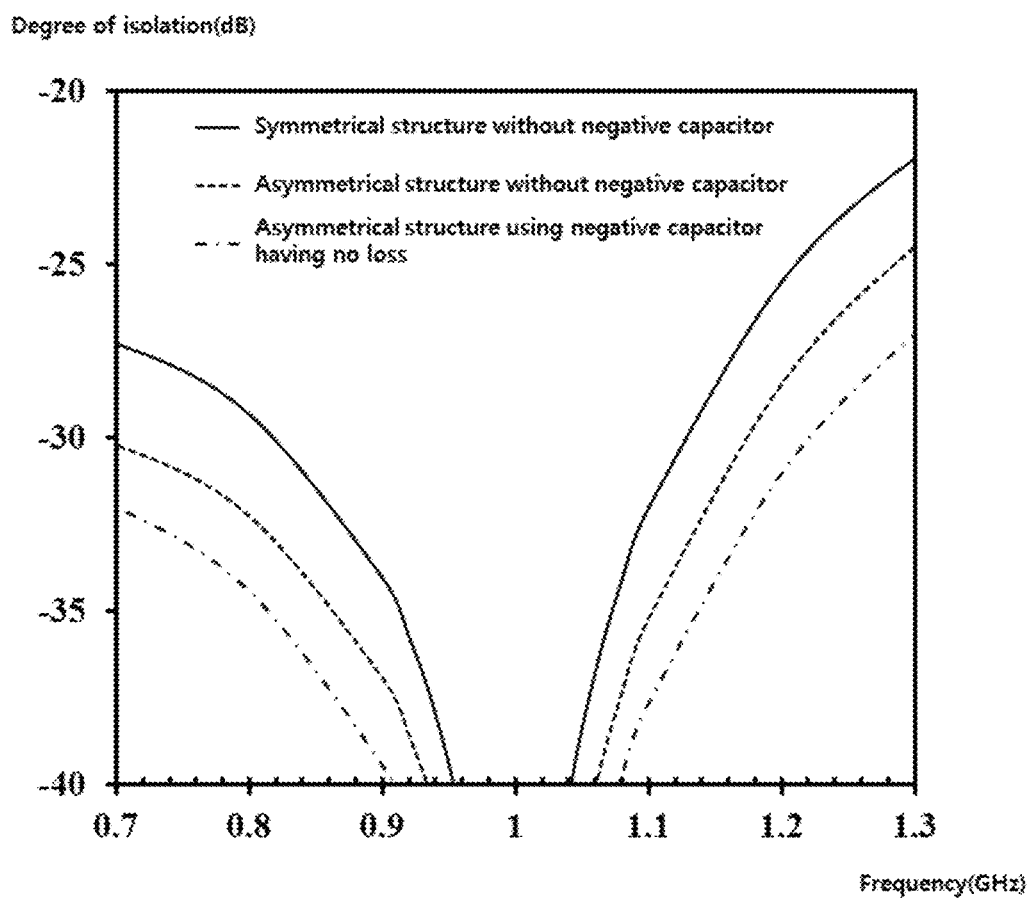
FIG. 6 is a graph illustrating the bandwidth of the directional coupler according to another exemplary embodiment.

FIG. 5 is a circuit diagram illustrating a lumped element directional coupler according to another exemplary embodiment.

Described in more detail with reference to FIG. 5, a first capacitor $C_T$ and a second capacitor $C_c$ are connected to an input terminal P1 in parallel, and a first inductor $L_1/2$ is provided between the first capacitor $C_T$ and the second capacitor $C_c$ to be connected to the first capacitor $C_T$ and the second capacitor $C_c$ in parallel. A second inductor $L_1/2$ is connected to the first inductance $L_1/2$ in parallel. The second inductor $L_1/2$ is provided between a third capacitor $C_T'$ and a fourth capacitor $C_c'$ connected to the output terminal P2 in parallel, and is connected to the third capacitor $C_T'$ and the fourth capacitor $C_c'$ in parallel.

The second capacitor $C_c$ and a fifth capacitor $C_B$ are connected to a coupled terminal P3 in parallel, and a third inductor $(L_2-\Delta L_2)/2$ is provided between the second capacitor $C_c$ and the fifth capacitor $C_B$ to be connected to the second capacitor $C_c$ and the fifth capacitor $C_B$ in parallel. A negative capacitor element $C_N$ is connected to the third inductor $(L_2-\Delta L_2)/2$ in series, and a fourth inductor $(L_2-\Delta L_2)/2$ is connected to the negative capacitor element $C_N$ in series. The fourth inductor $(L_2-\Delta L_2)/2$ is provided between the fourth capacitor $C_c'$ and a sixth capacitor $C_B'$ connected to an isolated terminal P4 in parallel, and is connected to the fourth capacitor $C_c'$ and the sixth capacitor $C_B'$ in parallel.

That is, the directional coupler according to another exemplary embodiment has an asymmetrical structure in which the negative capacitor element is added.

Here, the magnitude of the first capacitor $C_T$ is the same as the magnitude of the third capacitor $C_T'$, the magnitude of the second capacitor $C_c$ is the same as the magnitude of the fourth capacitor $C_c'$, and the magnitude of the fifth capacitor $C_B$ is the same as the magnitude of the sixth capacitor $C_B'$. The magnitude of the first capacitor $C_T$ is different from the magnitude of the fifth capacitor $C_B$.

Figure 10A:
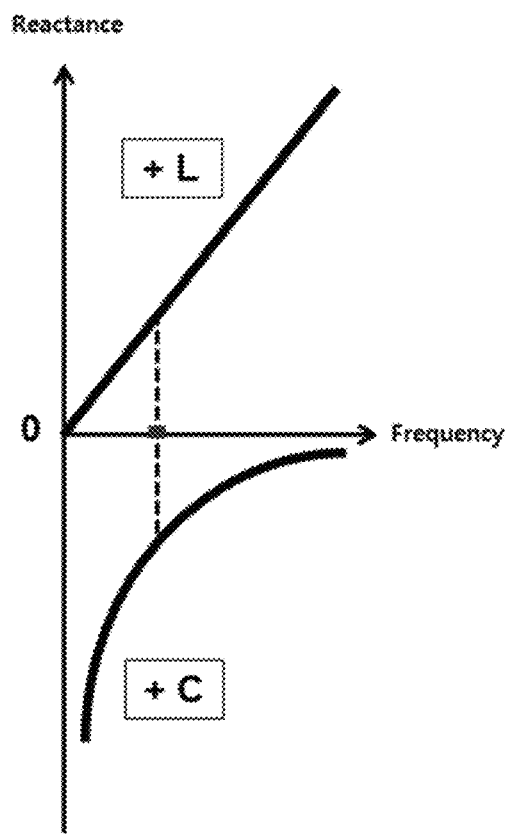
FIGS. 10A and 10B are diagrams illustrating the relationships between reactance and frequency depending on types of elements.

Describing the negative capacitor element in more detail, all passive elements follow Foster's reactance theorem, in which the relationship between reactance and frequency has a positive inclination, as illustrated in FIG. 10A. There is a limit to matching using passive elements following this theorem. For example, when a reactance value produced from an inductor must be canceled for circuit matching, the reactance value can be canceled using the reactance of a capacitor. However, a frequency range in which the two reactance values are canceled must be significantly narrow. When broadband matching is intended, reflection loss responsively increases, thereby reducing power transmission efficiency. This is referred to as the Bode-Fano limit.

Figure 10B:
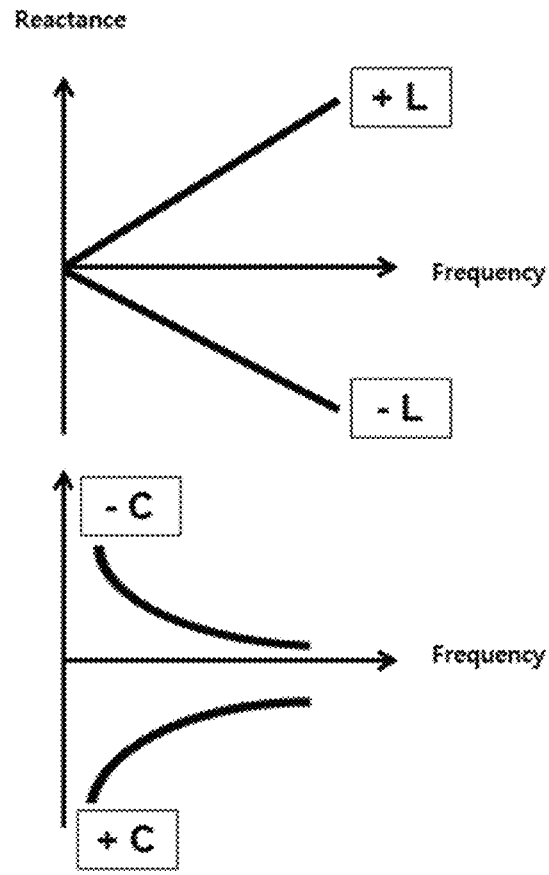

Unlike existing passive elements, a negative inductor having a negative inductance −L or a negative capacitor having a negative capacitance −C has a negative inclination contrary to Foster's reactance theorem, as illustrated in FIG. 10B. When such an element is present, matching exceeding the Bode-Fano limit is possible, since impedance can be canceled in all frequencies. Such elements are generally referred to as non-Foster elements. Non-Foster elements cannot be provided using existing passive elements but can be provided as a combination of positive circuits, such as a transistor.

The present disclosure is based on the characteristics of the negative capacitor element. The negative capacitor acts the same as an inductor regardless of different phases. Accordingly, the negative capacitor element added capacitor between the third inductor and the fourth inductor can increase a bandwidth. More specifically, when each of the third inductor and the fourth inductor is required to have an inductance of $L_2/2$, each inductance of the third inductor and the fourth inductor is set to be $(L_2-\Delta L_2)/2$, and a negative capacitor element $C_N$, a non-Foster element, may be added between the third inductor and the fourth inductor. In this case, it will be appreciated that the negative capacitor element $C_N$ provides positive reactance corresponding to $\Delta L_2/2$ to each of the third inductor and the fourth inductor, thereby increasing the bandwidth.

According to the present disclosure, the bandwidth is increased when the inductance of the third inductor or the fourth inductor is reduced instead of increasing the capacitance of the negative capacitor element. This accordingly reduces the magnitude of inductive coupling between the first inductor and the third inductor or the magnitude of inductive coupling between the second inductor and the fourth inductor, thereby reducing the amount of electric power distributed. Accordingly, it is possible to adjust the bandwidth and the amount of electric power distributed by adjusting the magnitude of the capacitance of the negative capacitor element, depending on fields to which the present disclosure is applied.

Figure 7:
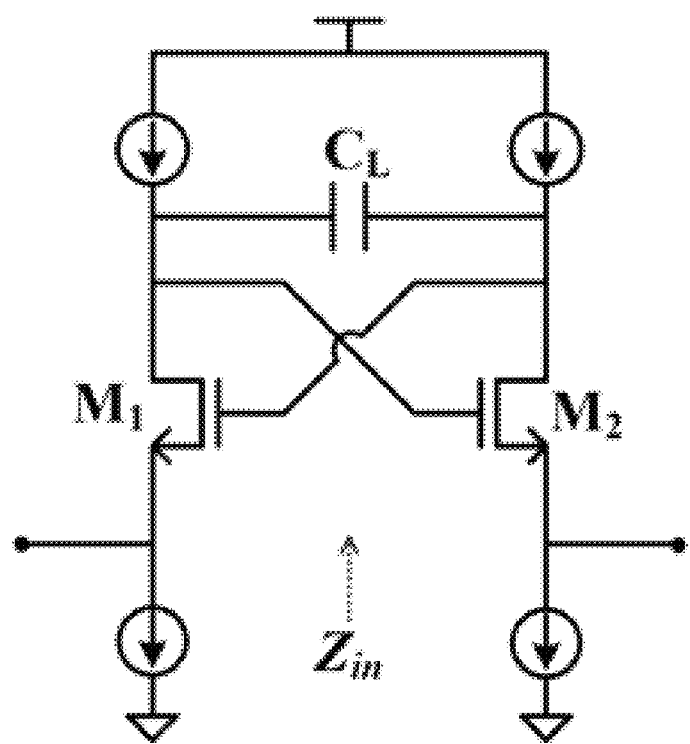
FIG. 7 is an exemplary circuit diagram illustrating a negative capacitor.

PA FIG. 7 is a circuit diagram illustrating an exemplary negative capacitor element. When the negative capacitor element is used, the impedance of both terminals is expressed as per following Formula 9.

$$Z_{in} = \frac{2}{g_m} + \frac{1}{s(-C_L)} \quad (9)$$

The magnitude of capacitance of the negative capacitor element is determined by the magnitude of $C_L$, and the loss of the negative capacitor element is determined by the transconductance $g_m$ of two metal oxide semiconductor (MOS) transistors $M_1$ and $M_2$ providing cross-linking. The loss of the negative capacitor element can be appreciated by increasing the bandwidth of the isolation characteristic. According to another exemplary embodiment, the bandwidth is increased with increases in the loss of the negative capacitor element.

Depending on fields to which the present disclosure is applied, the negative capacitor element may be comprised of a first negative capacitor element providing positive reactance corresponding to the magnitude of $\Delta L_2/2$ to the third inductor and a second negative capacitor element providing positive reactance corresponding to the magnitude of $\Delta L_2/2$ to the fourth inductor, without departing from the scope of the present disclosure. The negative capacitor element may be fabricated from a combination of an active element and a passive element, as described above. The negative capacitor element can be comprised of the first negative capacitor element and the second negative capacitor element. Advantageously, it is possible to increase the loss of the negative capacitor element while reducing the volume of the negative capacitor element.

Figure 8:
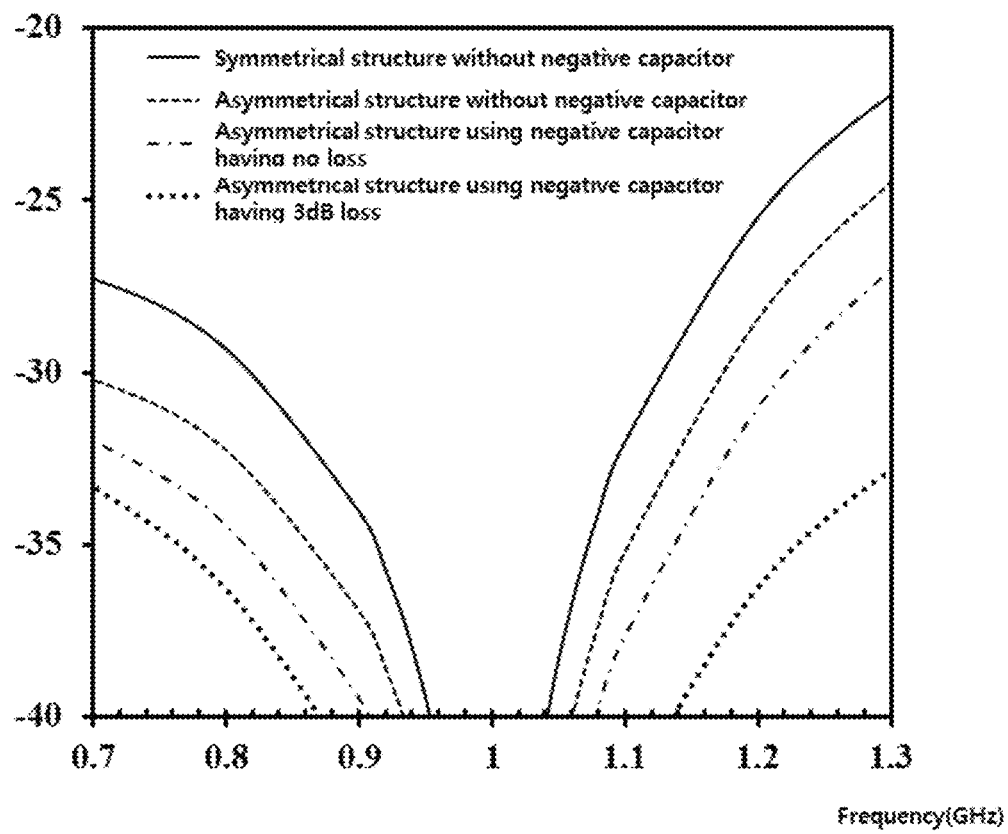
FIG. 8 is a graph comparing an isolation characteristic of a negative capacitor having loss of 3 dB with a case in which a negative capacitor does not have loss and a case in which the negative capacitor is not used.
Figure 9:
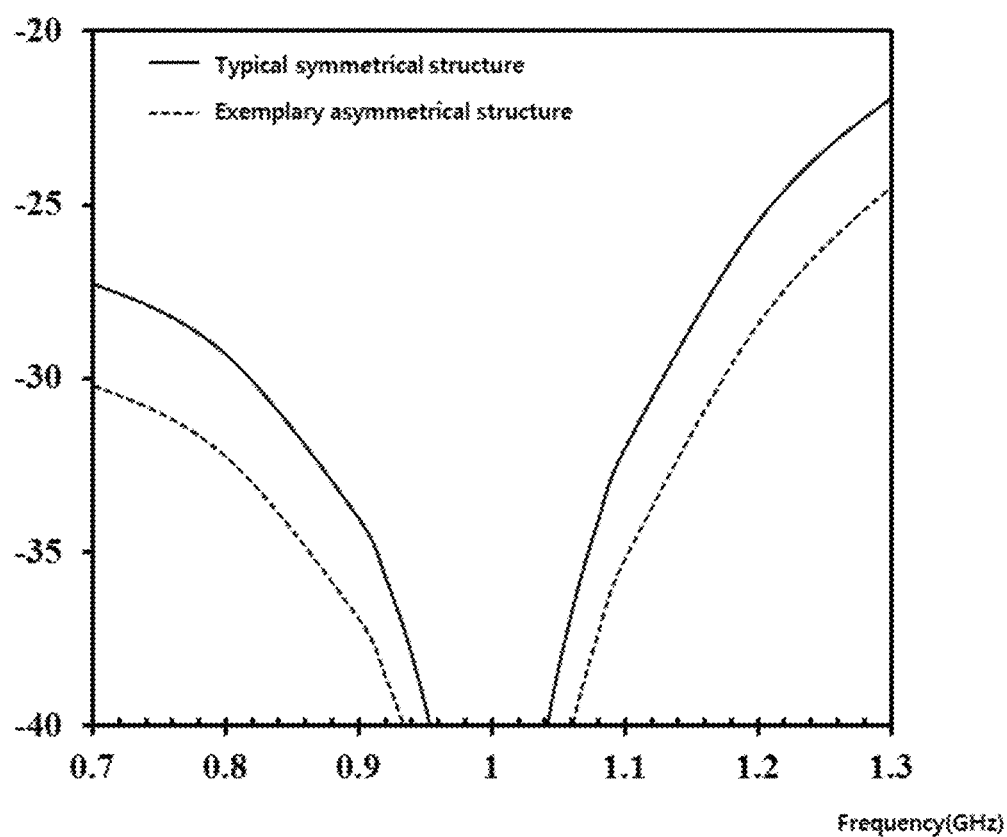
FIG. 9 is a graph illustrating the bandwidth of the lumped element directional coupler having an asymmetrical structure according to an exemplary embodiment.

FIG. 8 is a graph comparing an isolation characteristic of a negative capacitor element having loss of 3 dB with a case in which a negative capacitor element (NCAP) does not have loss and a case in which the negative capacitor element is not used. As illustrated in FIG. 8, on the basis of the isolation characteristic of −40 dB, when the negative capacitor element having loss of 3 dB is used, the isolation characteristic has a bandwidth of 260 MHz. The bandwidth is increased by 53%, compared to the case in which the negative capacitor element does not have loss, and by 189%, compared to a typical symmetrical structure in which the negative capacitor element is not used.

The above-described embodiments of the present disclosure can be recorded as computer executable programs, and can be realized in a general purpose computer that executes the program using a computer readable recording medium.

Examples of the computer readable recording medium include a magnetic storage medium (e.g. a floppy disk or a hard disk), an optical recording medium (e.g. a compact disc read only memory (CD-ROM) or a digital versatile disc (DVD)), and a carrier wave (e.g. transmission through the Internet).

While the present disclosure has been described with reference to the certain exemplary embodiments shown in the drawings, these embodiments are illustrative only. Rather, it will be understood by a person skilled in the art that various modifications and equivalent other embodiments may be made therefrom. Therefore, the true scope of the present disclosure shall be defined by the concept of the appended claims.

What is claimed is:

1. A directional coupler comprising an input terminal, an output terminal, a coupled terminal, and an isolated terminal,
    wherein a magnitude of impedance between the input terminal and the output terminal is different from a magnitude of impedance between the coupled terminal and the isolated terminal,
    wherein:
    a first capacitor and a second capacitor are connected to the input terminal and the output terminal, respectively, and have same levels of capacitance,
    a third capacitor and a fourth capacitor are connected to the coupled terminal and the isolated terminal, respectively, and have same levels of capacitance, and
    the first capacitor and the third capacitor have different levels of capacitance.

2. The directional coupler according to claim 1, wherein a magnitude of impedance between the input terminal and the coupled terminal is same as a magnitude of impedance between the coupled terminal and the isolated terminal.

3. The directional coupler according to claim 1, wherein a first inductor and a second inductor are connected between the input terminal and the output terminal in series,
    a third inductor inductively coupled to the first inductor and a fourth inductor inductively coupled to the second inductor are connected between the coupled terminal and the isolated terminal in series, and a negative capacitor element having a positive reactance component is provided between third inductor and the fourth inductor and connected to the third inductor and the fourth inductor in series.

4. The directional coupler according to claim 3, wherein, when each of the third inductor and the fourth inductor has reactance of $(L-\Delta L)/2$, the negative capacitor element provides reactance of $\Delta L/2$ to each of the third inductor and the fourth inductor.

5. The directional coupler according to claim 3, wherein the negative capacitor element comprises:

a first negative capacitor element connected to the third inductor in series to provide a positive reactance component to the third inductor; and a second negative capacitor element connected to the fourth inductor in series to provide a positive reactance component to the fourth inductor.

6. The directional coupler according to claim 5, wherein, when each of the third inductor and the fourth inductor has reactance of $(L-\Delta L)/2$, the negative capacitor element provides reactance of $\Delta L/2$ to each of the third inductor and the fourth inductor.

* * * * *